US012625172B2

(12) United States Patent
Lee et al.

(10) Patent No.: US 12,625,172 B2
(45) Date of Patent: May 12, 2026

(54) APPARATUS FOR TESTING IMAGE SENSOR AND OPERATING METHOD THEREOF

(71) Applicant: Samsung Electronics Co., Ltd., Suwon-si (KR)

(72) Inventors: Seongkwan Lee, Suwon-si (KR); Minho Kang, Suwon-si (KR); Hyungsun Ryu, Suwon-si (KR); Cheolmin Park, Suwon-si (KR); Jaemoo Choi, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 293 days.

(21) Appl. No.: 18/183,446

(22) Filed: Mar. 14, 2023

(65) Prior Publication Data

US 2024/0053391 A1 Feb. 15, 2024

(30) Foreign Application Priority Data

Aug. 11, 2022 (KR) ........................ 10-2022-0100786

(51) Int. Cl.
  *G01R 27/08* (2006.01)
  *G01R 31/28* (2006.01)
  *G01R 35/00* (2006.01)
(52) U.S. Cl.
  CPC ......... *G01R 27/08* (2013.01); *G01R 31/2851* (2013.01); *G01R 35/005* (2013.01)
(58) Field of Classification Search
  CPC .. G01R 27/08; G01R 31/2851; G01R 35/005; G01R 31/2839; G01R 31/282;

(Continued)

(56) References Cited

U.S. PATENT DOCUMENTS 5,006,809 A * 4/1991 Mang ..................... G01R 27/02
                                                             324/715
6,008,683 A 12/1999 Gillette
              (Continued)

FOREIGN PATENT DOCUMENTS

JP    2002040098 A * 2/2002 ......... G01R 31/3004
KR    804645 B1 * 2/2008 ............ H03M 3/464
              (Continued)

OTHER PUBLICATIONS

Translation of CN 1033421 A (Year: 1989).*
Translation of CN 103973194 A (Year: 2014).*
Translation of CN 105842539 A (Year: 2016).*

*Primary Examiner* — Paresh Patel
(74) *Attorney, Agent, or Firm* — Wolf, Greenfield & Sacks, P.C.

(57) ABSTRACT

An apparatus for testing an image sensor includes a load resistor, a first switch configured to be electrically connected to a first signal line of a device under test and a first end of the load resistor, a second switch configured to be electrically connected to a second signal line of the device under test and a second end of the load resistor, a first parametric measuring unit electrically connected to the first switch, and a second parametric measuring unit electrically connected to the second switch. At least one of the first parametric measuring unit and the second parametric unit is configured to correct an error of the load resistor during a testing operation of an output voltage of the device under test.

19 Claims, 9 Drawing Sheets

(58) Field of Classification Search
CPC .. G01R 19/14; G01R 19/16528; G01R 19/25;
G01R 27/02; G01R 35/007; H04N 17/002
USPC .................................................... 324/762.01
See application file for complete search history.

(56) References Cited

U.S. PATENT DOCUMENTS

| | | | | |
|---|---|---|---|---|
| 6,313,657 | B1 * | 11/2001 | Hashimoto | G01R 31/319 |
| | | | | 324/762.02 |
| 6,374,379 | B1 | 4/2002 | Walker et al. | |
| 6,489,798 | B1 * | 12/2002 | Scott-Thomas | H04N 25/76 |
| | | | | 348/E3.018 |
| 6,804,620 | B1 | 10/2004 | Larson et al. | |
| 7,403,030 | B2 | 7/2008 | Walker et al. | |
| 8,225,156 | B1 | 7/2012 | Tabatabaei et al. | |
| 10,502,790 | B2 * | 12/2019 | Lee | G01R 31/3648 |

| | | | | |
|---|---|---|---|---|
| 2002/0087924 | A1 * | 7/2002 | Panis | G01R 31/31716 |
| | | | | 714/712 |
| 2004/0051551 | A1 * | 3/2004 | Sunter | G01R 31/2886 |
| | | | | 324/762.02 |
| 2004/0085059 | A1 * | 5/2004 | Smith | G01R 31/2834 |
| | | | | 324/750.02 |
| 2006/0071683 | A1 * | 4/2006 | Best | H04L 25/0278 |
| | | | | 326/30 |
| 2007/0126455 | A1 * | 6/2007 | Yoshida | G01R 35/005 |
| | | | | 324/762.01 |
| 2009/0302861 | A1 | 12/2009 | Chang et al. | |
| 2014/0145745 | A1 | 5/2014 | Ryu et al. | |
| 2022/0101992 | A1 * | 3/2022 | Porter | A61B 5/01 |

FOREIGN PATENT DOCUMENTS

| | | | | |
|---|---|---|---|---|
| KR | 101306283 | B1 | 9/2013 | |
| KR | 2024073777 | A * | 5/2024 | H04N 23/52 |

* cited by examiner

APPARATUS FOR TESTING IMAGE SENSOR AND OPERATING METHOD THEREOF

CROSS-REFERENCE TO RELATED APPLICATION

This application claims the priority and benefit of Korean Patent Application No. 10-2022-0100786, filed on Aug. 11, 2022, with the Korean Intellectual Property Office, the disclosure of which is incorporated herein by reference.

FIELD

The present inventive concept relates to a semiconductor package and a method for manufacturing the semiconductor package.

BACKGROUND

In general, a testing apparatus may test a single device under test (DUT) using a power supply signal line. The testing apparatus sends and receives signals to and from each semiconductor device under test by a test program operated by a central processing unit (CPU), and tests an electrical function of each semiconductor device under test. In such a testing apparatus, a test time for evaluating the characteristics of the semiconductor chip may be increased as manufactured semiconductor chips become more highly integrated.

SUMMARY

An aspect of the present inventive concept is to provide an apparatus for testing an image sensor that does not require an additional variable resistor in order to reduce an error of a load resistor, and an operating method thereof.

An aspect of the present inventive concept is to provide an apparatus for testing an image sensor that can increase the number of devices under test capable of being tested simultaneously and an operating method thereof.

According to an aspect of the present inventive concept, in an apparatus for testing an image sensor, the testing apparatus includes a load resistor; a first switch that is configured to be electrically connected to a first signal line of a device under test and a first end of the load resistor; a second switch that is configured to be electrically connected to a second signal line of the device under test and a second end of the load resistor; a first parametric measuring unit electrically connected to the first switch; and a second parametric measuring unit electrically connected to the second switch. At least one of the first parametric measuring unit and the second parametric unit is configured to correct an error of the load resistor during a testing operation of an output voltage of the device under test.

According to an aspect of the present inventive concept, a method of operating an apparatus for testing an image sensor includes calculating a target load resistance value using a first resistance value of a first switch that is configured to be electrically connected to a first signal line of a device under test and a second resistance value of a second switch that is configured to be electrically connected to a second signal line of the device under test; measuring a test load voltage at first and second ends of a load resistor connected to the first switch and the second switch, respectively, in at least one parametric measuring unit; calculating a calibration current corresponding to the target load resistance value using the test load voltage; and providing an output current from the at least one parametric measuring unit, wherein the output current is based on the calibration current.

According to another aspect of the present inventive concept, a method of operating an apparatus for testing an image sensor includes calculating a target load resistance value using a first resistance value of a first switch that is configured to be electrically connected to a first signal line of a device under test and a second resistance value of a second switch that is configured to be electrically connected to a second signal line of the device under test; determining whether an actual resistance value of a load resistor having a first end that is electrically connected to the first switch and a second end that is electrically connected to the second switch in at least one parametric measuring unit is greater than the target load resistance value; measuring a test load voltage across the first and second ends of the load resistor while increasing a calibration current in a direction opposite to that of a current flowing through the load resistor in a corresponding parametric measuring unit of the at least one parametric measurement unit when the actual resistance value is greater than the target load resistance value; and generating an output current based on the measuring of the test load voltage.

BRIEF DESCRIPTION OF DRAWINGS

The above and other aspects, features, and advantages of the present inventive concept will be more clearly understood from the following detailed description taken in conjunction with the accompanying drawings, in which.

DETAILED DESCRIPTION

Figure 1:
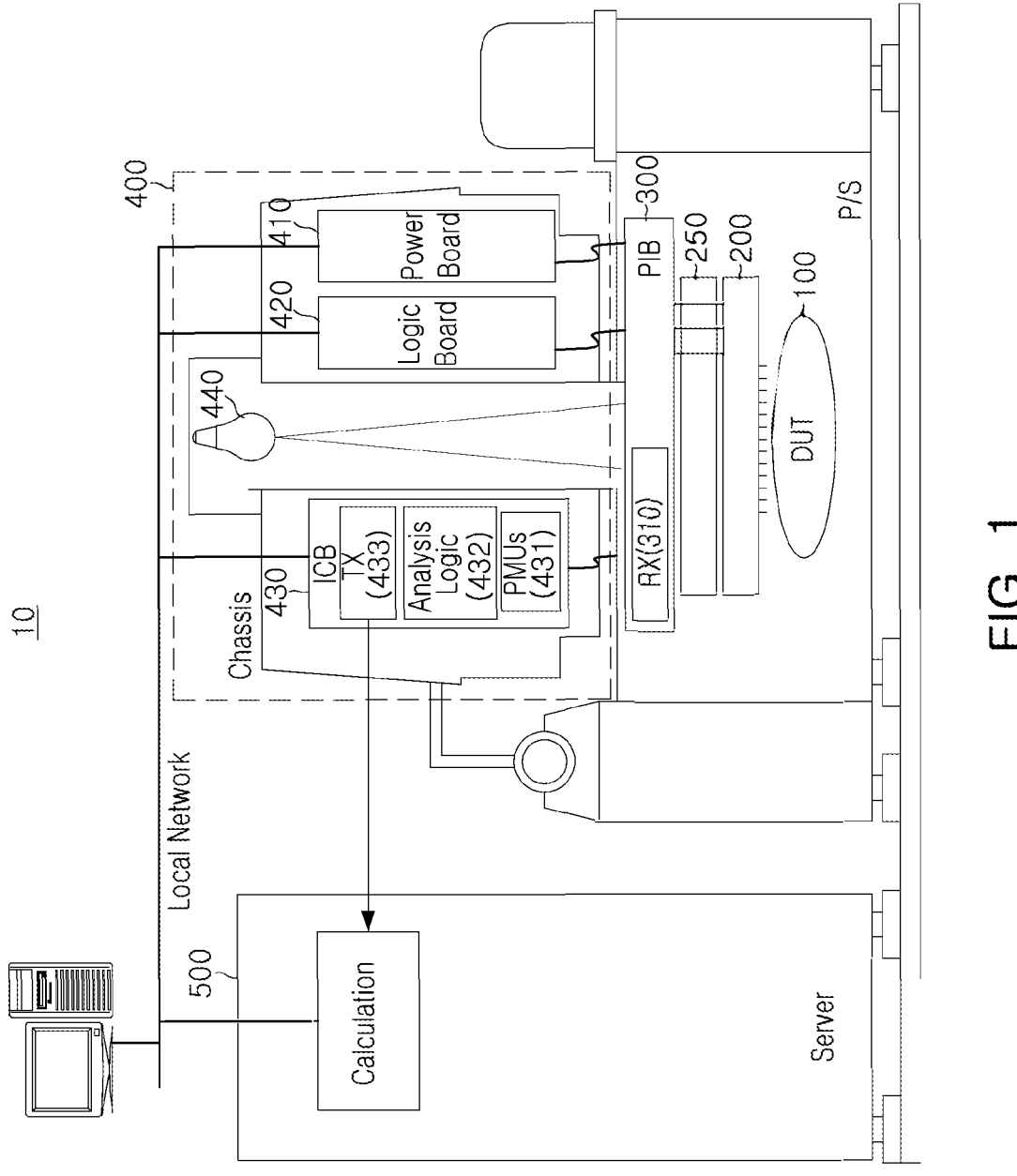
FIG. 1 is a view exemplarily illustrating a test facility according to an example embodiment of the present inventive concept.

Hereinafter, preferred embodiments of the present inventive concept will be described with reference to the accompanying drawings. Hereinafter, terms such as 'an upper side, 'an upper portion', 'an upper surface', a lower side, a lower portion, a lower surface, and the like, may be understood as referring to the drawings, except where otherwise indicated by reference numerals. Hereinafter, the content of the present invention will be described clearly and in detail to the extent that a person of ordinary skill in the art can easily implement it using the drawings.

A typical testing apparatus may require a variable resistor to be mounted in order to correct an error of a load resistor. Such a variable resistor requires additional space and can make it more difficult to achieve a target number of simultaneous testable semiconductor devices under test.

A testing apparatus and an operating method thereof according to an example embodiment of the present inventive concept may generate an active resistor using a parametric measurement unit (PMU) without a variable resistor, and correct an error of a load resistor seen in or at a device under test (DUT) using the generated active resistor. Such a testing apparatus and an operating method thereof according to an example embodiment of the present inventive concept may allow an increase in the number of devices under test capable of being simultaneously tested. In particular, in the testing apparatus and the operating method thereof of the present inventive concept, when resistance deviation occurs during periodic management of equipment, automatic calibration may be performed within a process line within a relatively short time without taking out the testing apparatus (e.g., for calibration) or otherwise affecting operation of a test facility. A "unit" (such as the PMUs described herein) may be implemented by one or more circuits as described herein.

FIG. 1 is a view exemplarily illustrating a test facility 10 according to an example embodiment of the present inventive concept.

Referring to FIG. 1, the test facility 10 may include a device under test (DUT) 100, which is an object to be tested, a probe card 200, a pogo block 250, an interface board (PIB) 300, a testing apparatus 400, and a computing device 500.

The DUT 100 is a device that requires verification before product release. The DUT 100 according to an example embodiment of the present inventive concept may be an image sensor. The DUT 100 may be at least one image sensor on a wafer or a CMOS image sensor manufactured in a form of a package. In general, the configuration of an image sensor is largely divided into an image sensing unit and an image signal processing unit. The image signal processing unit performs a function of image processing of interpolating the encoded signal from the image sensing unit to reconstruct the signal as an image signal. In an example embodiment, the image sensing unit and the image signal processing unit may each be configured as separate chips.

In another example embodiment, the image sensing unit and the image signal processing unit may be configured in a form of a single chip using a system on chip (SoC) technology. A plurality of pixels arranged in a matrix form are included in a region in which a plurality of rows and a plurality of columns intersect in the image sensing unit. Each of the pixels converts an electric charge induced by the input light into a voltage value. A voltage in an analog form generated from each of the pixels is converted into a digital form through Correlated Double Sampling (CDS). The converted digital data is input to an image processing unit, and reconstructed into an image signal. A final output signal of the image sensor is generated from the image processing unit. Therefore, in order to test the operating characteristics of the image sensor, an output of the image processing unit generating the final output signal should be used. In general, tens to millions of unit pixels are provided in an image sensor. This presents a technological problem in that a lot of test time may be required to test all of the data detected from the pixels.

The probe card 200 may be provided to perform a test process for testing electrical characteristics of a device under test (DUT). For example, the probe card 200 may apply an electrical signal to the image sensors formed on a wafer, and may be provided to perform an Electric Die Sorting (EDS) process for determining whether the image sensors are defective by signals output from the image sensors in response to the applied electrical signal. Also, the probe card 200 may be applied to an arbitrary test process for testing whether a plurality of image sensors are defective.

For example, the probe card 200 may apply an electrical signal provided from the testing apparatus 400, for example, power and/or other signal to a wafer including a plurality of image sensors, and provide a signal output (e.g., from at least one image sensor of the wafer) in response to the applied electrical signal to the testing apparatus 400. During a test process, a probe pin may physically contact a pad on a wafer to transmit an electrical signal to the wafer, or receive a signal output from the wafer. At least a portion of the probe pin may be an input probe pin for transmitting an electrical signal provided from the testing apparatus 400 to the wafer. In addition, at least a portion of the probe pin may be an output probe pin for receiving an electrical signal output from the wafer. Such a probe pin may be referred to as a probe needle or a probe. In an example embodiment, the probe card 200 may be a cantilever probe card, a vertical probe card, a membrane probe card, or the probe card 200 may be a micro-electro-mechanical systems (MEMS) probe card.

The probe card 200 has as many probes as the number of input and output pads/pins of the DUT 100 for directly electrically connecting the DUT 100. In general, if the number of input and output pads of the DUT 100 is 10 and the number of probes of the probe card 200 is 100, the testing apparatus 400 may simultaneously test 10 DUTs 100. However, in general, the number of probes of the probe card 200 is limited by the number of signal lines provided by the test device 400. An input probe of the probe card 200 is connected to the DUT 100, and an output probe of the probe card 200 is connected to an interface board 300. Accordingly, the probe card 200 may provide more probes than the number of signal lines provided by the testing apparatus 400.

The pogo block POGO 250 may include a plurality of pins for connecting the probe card 200 and the interface board 300. Here, each of the plurality of pins may include a POGO pin.

The interface board 300 may be implemented to map the probe card 200 and the testing apparatus 400. Also, the interface board 300 may include an active interface module for compensating for signal loss due to the probe card 200 and the pogo block 250. An active interface module may be implemented corresponding to a communication standard of the DUT 100. In an example embodiment, the active interface module may be implemented to be inserted into the interface board 300 through a module connector in a modular manner. For example, the active interface module may be implemented in any one of Mobile Industry Processor Interface (MIPI) C-PHY, MIPI D-PHY, MIPI M-PHY, and MIPI A-PHY. MIPI is a serial interface connecting hardware and software between a processor and peripheral devices. The active interface module may additionally convert the compensated signal into a signal advantageous for a long-distance signal. In an example embodiment, the active interface module may add a signal compensation circuit for compensating for a loss between the wafer and the probe card 200 and between the pogo block 250 and the interface board 300.

In an example embodiment, the active interface module may include a long-distance signal generating circuit that is changed to a differential signal level advantageous for a long distance without changing a speed of a frequency. In an example embodiment, the active interface module may include a standard corresponding circuit capable of responding even if an interface output from the wafer is changed. The active interface module may modularize the above-described signal compensation circuit, long-distance signal generating circuit, and standard corresponding circuit. Meanwhile, it should be understood that the active interface module of the present invention is not limited to the above-described MIPI standards. The active interface module of the present inventive concept may perform communication according to any type of communication interface corresponding to a serial interface standard output from a CMOS image sensor.

In addition, the interface board 300 may include an output receiver (RX) 310 for receiving an output signal of the DUT 100. The output receiver 310 may receive an image signal of the DUT 100 transmitted from an output probe of the probe card 200.

The testing apparatus 400 may be implemented to transmit input and control signals to at least one image sensor through the probe card 200. The testing apparatus 400 may be implemented to simultaneously test the DUT 100. Here, the DUT 100 may include a wafer having a plurality of image sensors. In an example embodiment, the testing apparatus 400 may be connected to an interface board 300 through a cable.

The testing apparatus 400 may be implemented to perform a signal analysis function, a DC test function, and a reference voltage control function. The signal analysis function may receive an image signal from the DUT 100, and analyze the received image signal. The signal analysis function can correct errors that occur when a high-speed serial signal is distorted by an influence of a transmission line or a time delay occurs. The DC test function may receive a voltage of an output pad of the DUT 100, and perform a DC test by comparing the received voltage with a test load voltage. A reference voltage control function may control a reference voltage generating circuit of the interface board 300 in order to reduce variations between components.

The testing apparatus 400 may include a power supply device (DPS) 410, a device under test controller 420, an image capture board (ICB) 430, and a light source 440. The power supply device (DPS) 410 may be implemented to supply power to the interface board 300. The device under test controller 420 may be configured to output an image from the DUT 100. The image capture board (ICB) 430 may be implemented to analyze the image signals received from the interface board 300, and output the analyzed signals to the computing device (COM) 500.

As illustrated in FIG. 1, the image capture board 430 may include at least one PMU 431, an analysis logic 432, and a transmitter 433.

The at least one PMU 431 may be implemented to test the electrical characteristics of the device under test (DUT) by applying a voltage/current to a signal line or measuring the voltage/current of the signal line. In an example embodiment, the PMU 431 may transmit a test current to a signal line corresponding to a signal line open test. In an example embodiment, the PMU 431 may generate an active resistor in order to reduce or eliminate an error of a load resistor during a n output voltage test of the device under test (DUT). The transmitter 433 may be implemented to transmit the analyzed signals to an analysis logic 432 to the computing device 500. A light source 440 may be implemented to deliver an input (i.e., light) to the DUT 100. The light source 440 may input various illuminances to the DUT 100. That is, the testing apparatus 400 controls the light source 440 to output various levels of brightness (i.e., illuminance) to the DUT 100. The DUT 100 may transmit an output signal (i.e., an image signal) corresponding to the input illuminance to an output receiver RX through an output probe of the probe card 200.

The computing device 500 may be implemented to image-process a signal transmitted from the test device 400. The image-processed data in this manner may be transmitted to an external device through a network.

A general or conventional test facility may be implemented as a testing apparatus using a variable resistor to set a load resistor of the signal line to about 100Ω in an output voltage testing operation of the device under test (DUT). However, such a variable resistor is typically large in size, which presents a technological problem in that it may be difficult or impossible to mount the variable resistor in an available space in the testing apparatus. In contrast, the test facility 10 according to an example embodiment of the present inventive concept is implemented as a testing apparatus 400 using an active resistor generated by a PMU 431 to correct a load resistance error of an output voltage testing operation, so that an additional variable resistor is not required.

Figure 2:
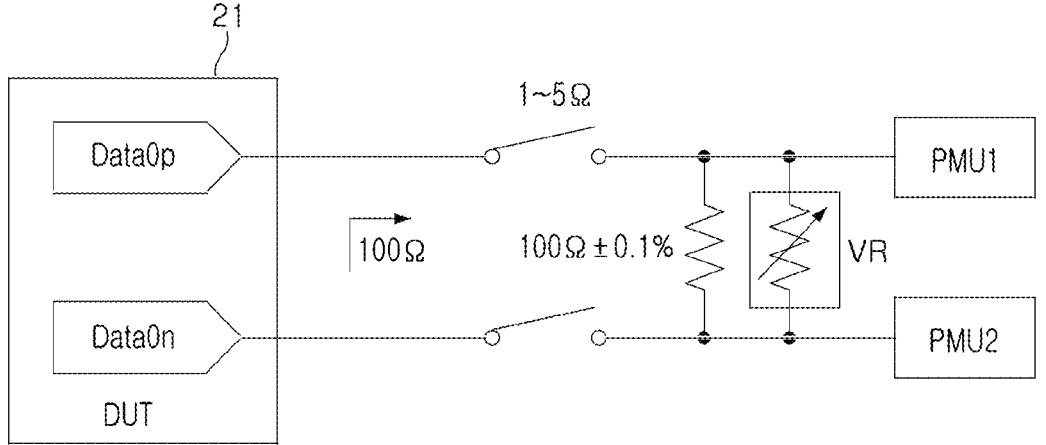
FIG. 2 is a diagram illustrating a process of varying a load resistor in a general or conventional testing apparatus.

FIG. 2 is a view illustrating a process of varying a load resistor in a general or conventional testing apparatus. In general, in a testing operation of the image sensor, there is an item for to sting an output voltage of the DUT in a state in which a load resistor of an output signal line circuit seen in or at the DUT 21 is about 100Ω. However, a load resistance error (also referred to herein as an error of a load resistor) can occur due to a parasitic resistance distribution such as an on resistance of a semiconductor switch. Therefore, an accurate test may be performed only when the load resistor of the signal line is corrected. In general, a pre-calibration error is 5%, and a calibration target error is <1%. In the case of a general or conventional testing method, by adding a variable resistor VR in parallel to the 100Ω resistor to reduce a combined resistor of the 100Ω resistor and the variable resistor VR, a total load resistance including a semiconductor switch resistor is set to 100Ω. However, in the case of a rotational variable resistor, a magnitude of the resistor may be too large to be mounted in an available space. A typical receiving circuit requires 5 or more variable resistors per DUT. Meanwhile, in order to secure a space for such a variable resist or, it may be necessary to change a structure of the facility. In addition, if a load resistance value does not exist within a required reference value during periodic management, automatic calibration in the process line may not be performed. After taking out the testing apparatus to the manufacturer, the variable resistor may need to be adjusted again. For example, 1280 variable resistors may need to be adjusted during factory calibration after the initial production of the test facility.

Figure 3:
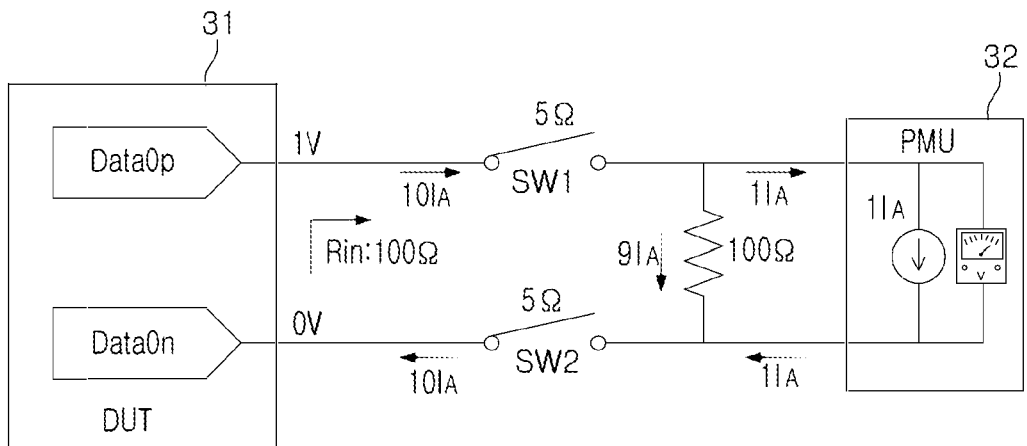
FIG. 3 is a diagram conceptually illustrating a process of varying a load resistor in the testing apparatus according to an example embodiment of the present inventive concept.

FIG. 3 is a diagram conceptually illustrating a process of varying a load resistor in a testing apparatus 400 according to an example embodiment of the present inventive concept.

The testing apparatus 400 may form an active resistor by removing (e.g., eliminating the need for or omitting) the existing variable resistor and using a current output function of the PMU 32. A load resistor or load resistance may be corrected to a desired value by such an active resistor. For convenience of explanation, it will be assumed that the load resistor seen in or at the DUT 31 is 110Ω instead of 100Ω in a situation in which parasitic resistance of the switches SW1 and SW2 is generated in a total amount of 10Ω. When 1V is applied from the DUT 31, 9 $I_A$ flows, instead of the desired 10 $I_A$.

In this case, a current of 1$I_A$ may flow by using a current output function of the PMU 32 (e.g., to generate an amount of current that compensates for resistance deviations from an expected load resistance), also referred to herein as providing an active resistor. Then, the load resistance seen in or at the DUT 31 may be changed to 100Ω. 10 $I_A$ flows when 1V of the DUT 31 is output. An error of the load resistor seen in or at the DUT 31 can be corrected by making or providing an active resistor using the PMU 32 already existing, without or free of a variable resistor, thereby providing a technological solution to problems associated with variable resistors as recognized herein. A method for correcting the load resistor achieves a target number of simultaneous testable DUTs. Even if a resistance deviation occurs during periodic management of equipment, automatic calibration is possible in a process line without taking out the testing apparatus (e.g., without physically removing the testing apparatus 400 from the test facility 10).

A general or conventional PMU is used only in a voltage measurement mode to measure an output voltage of the DUT. On the other hand, the PMU according to an example embodiment of the present inventive concept may operate not only in a voltage measurement mode but also in a current applied voltage measurement mode. In the current applied voltage measurement mode, the PMU may measure a voltage while outputting a predetermined current (also referred to as an output current) to the corresponding signal line.

Figure 4:
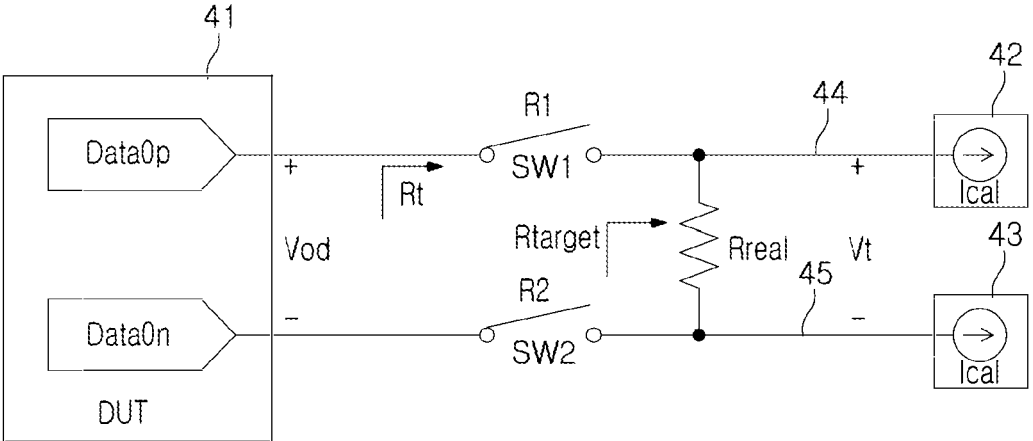
FIG. 4 is a diagram illustrating a process of setting a calibration current in a testing apparatus according to an example embodiment of the present inventive concept.

FIG. 4 is a diagram illustrating a process of setting a calibration current Ical in a testing apparatus according to an example embodiment of the present inventive concept.

First, a first resistor R1 and a second resistor R2 are measured and known through an external calibration board before an operation of the test facility 10 starts. Here, the first resistor R1 is a resistor or resistance of the first switch SW1, and the second resistor R2 is a resistor or resistance of the second switch SW2. There is an actual load resistor or resistance Rreal between a first signal line 44 and a second signal line 45. Here, the first signal line 44 is a positive signal line of data, and the second signal line 45 is a negative signal line of data. The test resistance value Rt shown in FIG. 4 is a load resistance value seen in or at the DUT 41. In this case, an open voltage Vod is applied between the first signal line 44 and the second signal line 45.

During the testing operation, a first PMU 42 may receive a calibration current Ical from the first signal line 44, and a second PMU 43 output a calibration current Ical to the second signal line 45. That is, at least one PMU 42, 43 may be configured to generate and output a predetermined output current (e.g., a calibration current Ical) to a respective one of the signals lines 44, 45, based on the actual load resistance Rreal.

Figure 5:
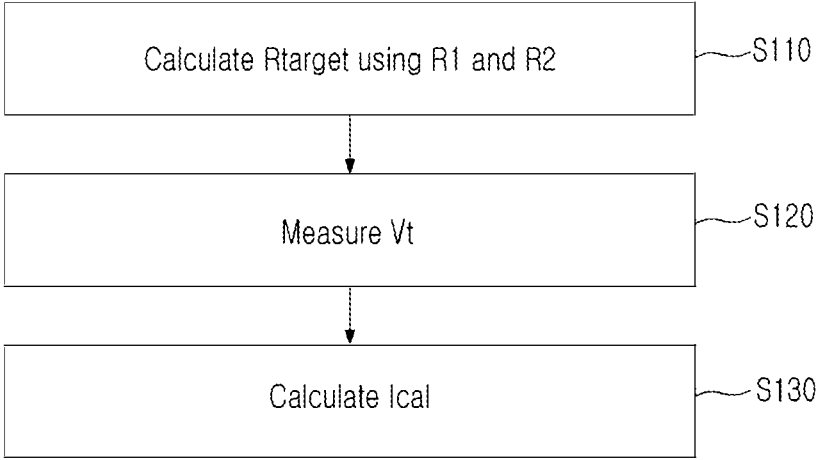
FIG. 5 is a flowchart exemplarily illustrating an operating method of the testing apparatus according to an example embodiment of the present inventive concept.

FIG. 5 is a flowchart exemplarily illustrating an operating method of the testing apparatus 400 according to an example embodiment of the present inventive concept. Referring to FIGS. 1 to 5, in the operating method of the testing apparatus 400, speed-priority one-shot correction may be performed as follows.

The testing apparatus 400 may calculate a target load resistance value Rtarget required for a testing operation (S110). Here, the target load resistance value Rtarget is a value obtained by subtracting a first resistance value R1 and a second resistance value R2 from the test resistance value Rt seen in or at the DUT 100. The first and second resistance values R1 and R2 may be measured on a diagnostic board. Thereafter, the testing apparatus 400 may measure a test load voltage Vt between the signal lines after setting a calibration current Ical to 0 (S120). Thereafter, the testing apparatus 400 may calculate a calibration current Ical using the test load voltage Vt (S130), and also the target resistance value Rtarget and the actual load resistance value Rreal. A target active resistor may be formed, desired in the present inventive concept by receiving or outputting the calculated calibration current Ical from the signal line.

Figure 6:
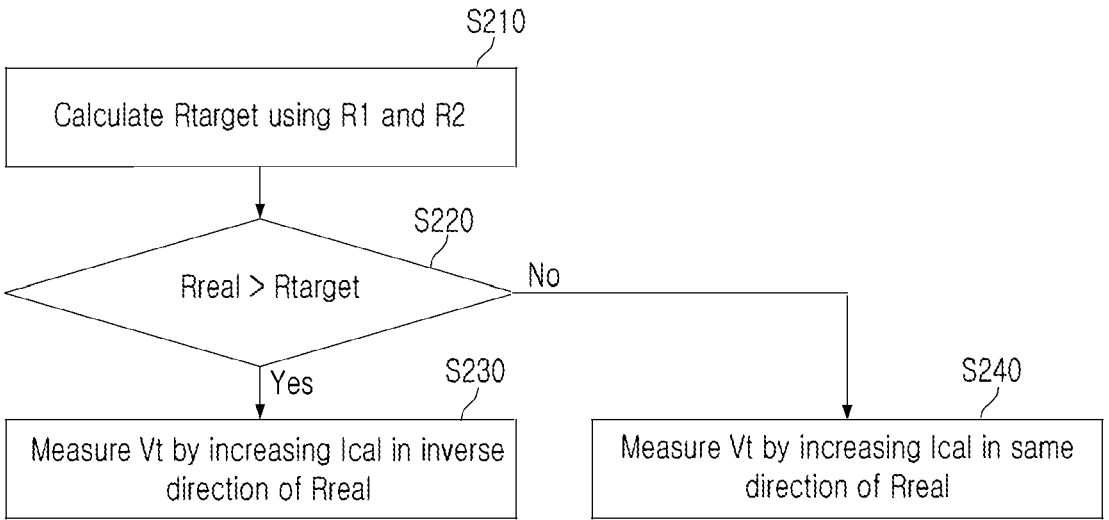
FIG. 6 is a flowchart exemplarily illustrating a method of operating a testing apparatus according to another example embodiment of the present inventive concept.

FIG. 6 is a flowchart exemplarily illustrating a method of operating a testing apparatus according to another example embodiment of the present inventive concept. Referring to FIGS. 1 to 6, in the operating method of the testing apparatus 400, accuracy-priority feedback correction may be performed as follows.

The testing apparatus 400 may calculate a target load resistance value Rtarget required for a testing operation (S210). It may be determined whether an actual load resistance value Rreal between the first signal line and the second signal line is greater than or less than a target load resistance value Rtarget, indicating a load resistance error. As used herein, a load resistance error (or error of a load resistor) may occur when there is a difference between the actual load resistance value Rreal and the target load resistance value Rtarget.

If the actual load resistance value Rreal is greater than the target load resistance value Rtarget, a load voltage Vt can be measured, while increasing a calibration current Ical in an opposite direction to a direction of the current flowing through an actual resistor Rreal (S230). This operation may be repeated until the load voltage Vt satisfies a predetermined value.

On the other hand, when the actual load resistance value Rreal is not greater than the target load resistance value Rtarget, a test load voltage Vt may be measured, while increasing a calibration current Ical in the same direction as the current flowing through the actual resistor Rreal(S240), and it may be adjusted until a predetermined function is satisfied.

Figure 7:
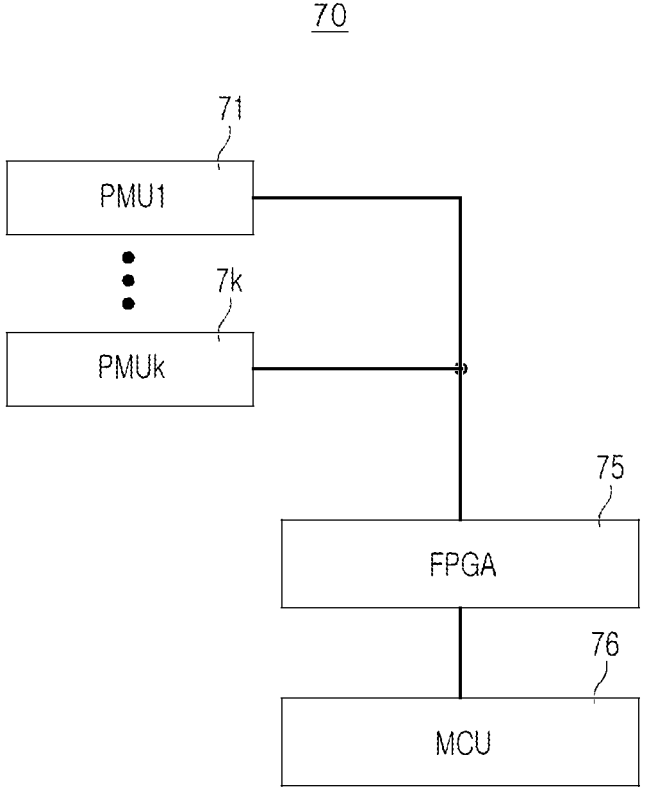
FIG. 7 is a view exemplarily illustrating a testing apparatus according to an example embodiment of the present inventive concept.

FIG. 7 is a view exemplarily illustrating a testing apparatus 70 according to an example embodiment of the present inventive concept. Referring to FIG. 7, the testing apparatus 70 may include a plurality of PMUs 71, . . . , 7k, and k is an integer greater than or equal to 2), a Field Programmable Gate Array (FPGA) 75, and a Micro Control Unit (MCU) 76.

Figure 8:
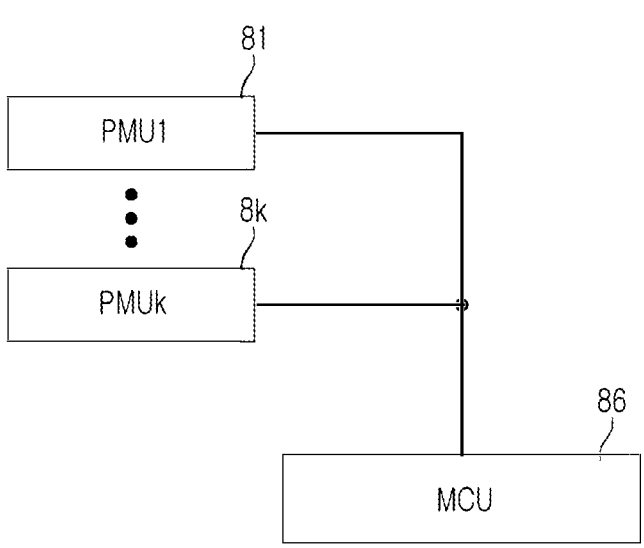
FIG. 8 is a view exemplarily illustrating a testing apparatus according to another example embodiment of the present inventive concept.

FIG. 8 is a view exemplarily illustrating a testing apparatus according to another example embodiment of the present inventive concept. Referring to FIG. 8, the testing apparatus 80 may include a plurality of PMUs 81, . . . , 8k, and k is integer greater than or equal to 2), and an MCU 86.

Figure 9:
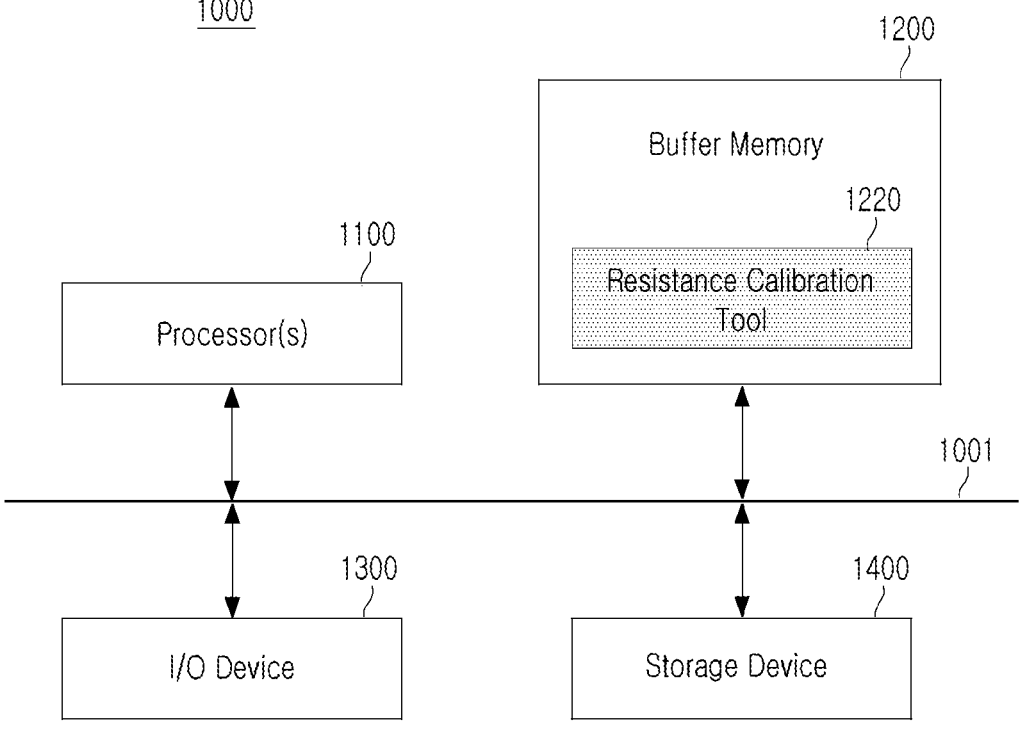
FIG. 9 is a diagram exemplarily illustrating a computing device that is configured to perform a testing operation according to an example embodiment of the present inventive concept.

FIG. 9 is a diagram exemplarily illustrating a computing device 1000 that is configured to perform a testing operation according to an example embodiment of the present inventive concept. Referring to FIG. 9, the computing device 1000 may include at least one processor 1100 connected to the system bus 1001, a memory device 1200, an input/output device 1300, and a storage device 1400. The computing device 1000 may be implemented as a computing device 500 for performing a short circuit test/output voltage test using a PMU as described in FIGS. 1 to 8.

The processor 1100, the memory device 1200, the input/output device 1300, and the storage device 1400 may be electrically connected through the system bus 1001 and exchange data with each other. Meanwhile, the configuration of the system bus 1001 is not limited to the above description, and may further include mediation means for efficient management.

At least one processor 1100 may be implemented to control an overall operation of the computing device 1000. The processor 1100 may be implemented to execute at least one instruction. For example, the processor 1100 may be implemented to execute software (application programs, operating systems, and device drivers), to be executed in the computing device 1000. The processor 1100 may execute an operating system loaded into the memory device 1200. The processor 1100 may execute various application programs to be driven based on an operating system. For example, the processor 1100 may drive a rendering tool (e.g., a resistance calibration tool) 1220 read from the memory device 1200. That is, the processor 1100 may be configured to execute computer readable program instructions operations read from the memory device 1200 to perform operations of a resistance calibration tool 1220 as described herein. In an example embodiment, the processor 1100 may be a central processing unit (CPU), a microprocessor, an application processor (AP), or any processing device similar thereto.

The memory device 1200 may be implemented to store at least one instruction. For example, the memory device 1200 may be loaded with an operating system or application programs. When the computing device 1000 is booted, the OS image stored in the storage device 1400 may be loaded into the memory device 1200 based on a booting sequence. All input/output operations of the computing device 1000 may be supported by the operating system. Similarly, thereto, application programs may be loaded into the memory device 1200 to be selected by a user or to provide a basic service. In particular, a resistance calibration tool 1220 required for the testing operation may be loaded from the storage device 1400 into the memory device 1200.

The memory device 1200 may be a volatile memory such as dynamic random access memory (DRAM), static random access memory (SRAM), or the like, or a non-volatile memory such as flash memory, phase change random access memory (PRAM), resistance random access memory (RRAM), Nano Floating Gate Memory (NFGM), Polymer Random Access Memory (PoRAM), Magnetic Random Access Memory (MRAM), Ferroelectric Random Access Memory (FRAM), or the like.

The input/output device 1300 may be implemented to control user input and output from the user interface device. For example, the input/output device 1300 may include input means such as a keyboard, a keypad, a mouse, and a touch screen to receive information from a designer or other user. Using the input/output device 1300, a designer may receive information about a semiconductor region or data paths requiring adjusted operating characteristics.

The storage device 1400 may be provided as a nontransitory storage medium of the computing device 1000. The storage device 1400 may store application programs, OS images, and various data. The storage device 1400 may be provided in a form of a mass storage device such as a memory card (MMC, eMMC, SD, Micro SD, and the like), a hard disk drive (HDD), a solid state drive (SSD), a universal flash storage (UFS), and the like.

According to the present inventive concept, a manufacturing or other error of a load resistor may be actively corrected by generating an active resistor using an MCU without or free of a variable resistor.

As set forth above, according to an example embodiment of the present inventive concept, in an apparatus for testing an image sensor and an operating method thereof, an error of a load resistor may be corrected by generating an active resistor using a parametric measuring unit during a testing operation of an output voltage of a device under test.

According to an example embodiment of the present inventive concept, in an apparatus for testing an image sensor and an operating method thereof, a receiving circuit that meets customer needs by correcting an error of a load resistor without using a variable resistor during the testing operation of the output voltage of the device under test may be quickly developed and implemented.

According to an example embodiment of the present inventive concept, in an apparatus for testing an image sensor and an operating method thereof, a target number of devices under test capable of being tested simultaneously may be achieved.

According to an example embodiment of the present inventive concept, in an apparatus for testing an image sensor and an operating method thereof, automatic calibration may be performed within a relatively short time without taking out or removing the test apparatus from the test facility when resistance deviations occur during periodic management of equipment.

Herein, a lower side, a lower portion, a lower surface, and the like, are used to refer to a direction toward a mounting surface of the fan-out semiconductor package in relation to cross sections of the drawings, while an upper side, an upper portion, an upper surface, and the like, are used to refer to an opposite direction to the direction. However, these directions are defined for convenience of explanation, and the claims are not particularly limited by the directions defined as described above.

The meaning of a "connection" of a component to another component in the description includes an indirect connection through an adhesive layer as well as a direct connection between two components without intervening components therebetween. In addition, "electrically connected" conceptually includes a physical connection and a physical disconnection. It can be understood that when an element is referred to with terms such as "first" and "second", the element is not limited thereby. They may be used only for a purpose of distinguishing the element from the other elements, and may not limit the sequence or importance of the elements. In some cases, a first element may be referred to as a second element without departing from the scope of the claims set forth herein. Similarly, a second element may also be referred to as a first element.

The term "an example embodiment" used herein does not refer to the same example embodiment, and is provided to emphasize a particular feature or characteristic different from that of another example embodiment. However, example embodiments provided herein are considered to be able to be implemented by being combined in whole or in part one with one another. For example, one element described in a particular example embodiment, even if it is not described in another example embodiment, may be understood as a description related to another example embodiment, unless an opposite or contradictory description is provided therein.

Terms used herein are used only in order to describe an example embodiment rather than limiting the present disclosure. In this case, singular forms include plural forms unless interpreted otherwise in context.

While example embodiments have been shown and described above, it will be apparent to those skilled in the art that modifications and variations could be made without departing from the scope of the present inventive concept as defined by the appended claims.

What is claimed is:

1. An apparatus for testing an image sensor comprising:
a load resistor;
a first switch electrically connected to a first signal line of a device under test and a first end of the load resistor;
a second switch electrically connected to a second signal line of the device under test and a second end of the load resistor;
a first parametric measuring unit electrically connected to the first switch;
a second parametric measuring unit electrically connected to the second switch; and
a calibration board configured to measure a first resistance value of the first switch and a second resistance value of the second switch, before a testing operation of an output voltage of the device under test,
wherein at least one of the first parametric measuring unit and the second parametric measuring unit is configured to correct an error of the load resistor during the testing operation of the output voltage of the device under test.

2. The apparatus of claim 1, wherein the resistance value of the load resistor is about 100Ω, and the apparatus is free of a variable resistor.

3. The apparatus of claim 1, wherein, during the testing operation of the output voltage of the device under test, a test resistance value of the apparatus as seen at the device under test is about 100Ω.

4. The apparatus of claim 1, wherein, when a target load resistance value is not greater than a resistance value of the load resistor during the testing operation of the output voltage of the device under test, a corresponding parametric measuring unit of the first and second parametric measurement units is configured to generate a current in an opposite direction to a current flowing through the load resistor in proportion to a measured load voltage,
wherein the target load resistance value is obtained by subtracting a first resistance value of the first switch and a second resistance value of the second switch from a test resistance value of the apparatus as seen at the device under test.

5. The apparatus of claim 1, wherein, when a target load resistance value is greater than a resistance value of the load resistor during the testing operation of the output voltage of the device under test, a corresponding parametric measuring unit of the first and second parametric measurement units is configured to generate a current in a same direction as a current flowing through the load resistor in proportion to a measured load voltage,
wherein the target load resistance value is obtained by subtracting a first resistance value of the first switch and a second resistance value of the second switch from a test resistance value of the apparatus as seen at the device under test.

6. The apparatus of claim 1, further comprising:
a Field Programmable Gate Array (FPGA) configured to control the first parametric measuring unit and the second parametric measuring unit during the testing operation of the output voltage of the device under test.

7. The apparatus of claim 6, further comprising:
a micro control unit (MCU) configured to control the FPGA.

8. The apparatus of claim 1, wherein each of the first and second parametric measuring units is configured to measure a test load voltage across the first and second ends of the load resistor after setting a calibration current to zero,
wherein an error of the load resistor is corrected based on the test load voltage by generating an output current having a value that is configured to compensate for a difference between an output resistance value and a target load resistance value indicated by the test load voltage.

9. The apparatus of claim 1, wherein each of the first and second parametric measuring units is configured to measure a test load voltage across the first and second ends of the load resistor by increasing a calibration current in a direction of current flow through the load resistor or in a direction opposite to that of the current flow,
wherein an error of the load resistor is corrected based on the test load voltage.

10. An apparatus for testing an image sensor comprising:
at least one parametric measuring unit; and
a controller configured to control the at least one parametric measuring unit,
wherein the controller is configured to:
calculate a target load resistance value using a first resistance value of a first switch electrically connected to a first signal line of a device under test and a second resistance value of a second switch electrically connected to a second signal line of the device under test;
measure a test load voltage at first and second ends of a load resistor connected to the first switch and the second switch, respectively, in the at least one parametric measuring unit;
calculate a calibration current corresponding to the target load resistance value using the test load voltage; and
provide an output current from the at least one parametric measuring unit, wherein the output current is based on the calibration current,
wherein the at least one parametric measuring unit is configured to correct an error of the load resistor during a testing operation of an output voltage of the device under test.

11. The apparatus of claim 10, wherein the controller is configured to measure the first resistance value and the second resistance value on a diagnostic board.

12. The apparatus of claim 10, wherein the target load resistance value is obtained by subtracting the first resistance value and the second resistance value from a test resistance value,
wherein the test resistance value is a resistance value of the load resistor as seen at the device under test.

13. The apparatus of claim 12, wherein the test resistance value is about 100Ω.

14. The apparatus of claim 12, wherein each of the first resistance value and the second resistance value is between about 1Ω to 5Ω.

15. An apparatus for testing an image sensor comprising:
at least one parametric measuring unit; and
a controller configured to control the at least one parametric measuring unit,
wherein the controller is configured to:
calculate a target load resistance value using a first resistance value of a first switch electrically connected to a first signal line of a device under test and a second resistance value of a second switch electrically connected to a second signal line of the device under test;
determine whether an actual resistance value of a load resistor having a first end electrically connected to the first switch and a second end electrically connected to the second switch in the at least one parametric measuring unit is greater than the target load resistance value;

measure a test load voltage across the first and second ends of the load resistor while increasing a calibration current in a direction opposite to that of a current flowing through the load resistor in a corresponding parametric measuring unit of the at least one parametric measuring unit when the actual resistance value is greater than the target load resistance value; and generate an output current based on the measuring of the test load voltage, wherein the at least one parametric measuring unit is configured to correct an error of the load resistor during a testing operation of an output voltage of the device under test.

16. The apparatus of claim 15, wherein the controller is configured to measure a test load voltage across the first and second ends of the load resistor while increasing a calibration current in a same direction as the current flowing through the load resistor in the corresponding parametric measuring unit, when the actual resistance value is not greater than the target load resistance value.

17. The apparatus of claim 15, wherein the controller is configured to correct an error of the load resistor based on the test load voltage by generating the output current having a value that is configured to compensate for a difference between the actual resistance value and the target load resistance value indicated by the test load voltage.

18. The apparatus of claim 15, wherein the controller is configured to measure the first resistance value and the second resistance value on a calibration board.

19. The apparatus of claim 15, wherein the controller is configured to transmit an output signal indicating the measured test load voltage to an external device.

* * * * *